(12) United States Patent
Lin

(10) Patent No.: US 10,886,406 B1
(45) Date of Patent: Jan. 5, 2021

(54) SEMICONDUCTOR STRUCTURE AND METHOD OF MANUFACTURING THE SAME

(71) Applicant: NANYA TECHNOLOGY CORPORATION, New Taipei (TW)

(72) Inventor: Chang-Chieh Lin, Yunlin County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/528,282

(22) Filed: Jul. 31, 2019

(51) Int. Cl.
*H01L 29/78* (2006.01)
*H01L 29/423* (2006.01)
*H01L 27/108* (2006.01)

(52) U.S. Cl.
CPC .... *H01L 29/7848* (2013.01); *H01L 27/10811* (2013.01); *H01L 27/10855* (2013.01); *H01L 27/10876* (2013.01); *H01L 27/10885* (2013.01); *H01L 29/4236* (2013.01)

(58) Field of Classification Search
CPC ........... H01L 29/7848; H01L 27/10876; H01L 27/10855; H01L 29/4236; H01L 27/10885; H01L 27/10811
USPC ........................................................ 257/190
See application file for complete search history.

(56) References Cited

U.S. PATENT DOCUMENTS

| | | | |
|---|---|---|---|
| 2008/0054250 A1* | 3/2008 | Chuang | H01L 29/66628 257/19 |
| 2013/0065394 A1* | 3/2013 | Suen | H01L 21/7684 438/672 |
| 2013/0207166 A1* | 8/2013 | Chen | H01L 21/02639 257/288 |
| 2015/0076560 A1* | 3/2015 | Wasyluk | H01L 21/823814 257/190 |
| 2017/0040451 A1* | 2/2017 | Huang | H01L 23/535 |
| 2019/0006241 A1* | 1/2019 | Yang | H01L 29/1054 |

* cited by examiner

*Primary Examiner* — Caleen O Sullivan
(74) *Attorney, Agent, or Firm* — Muncy, Geissler, Olds & Lowe, P.C.

(57) ABSTRACT

The present disclosure provides a semiconductor structure and a method for preparing the semiconductor structure. The semiconductor structure includes a substrate having a pattern-dense region and a pattern-loose region; a first drain stressor disposed in the pattern-dense region; a first source stressor disposed in the pattern-dense region; a buried gate structure disposed in the pattern-dense region, between the first drain stressor and the first source stressor; a second drain stressor disposed in the pattern-loose region; a second source stressor disposed in the pattern-loose region; and a planar gate structure disposed in the pattern-loose region, between the second drain stressor and the second source stressor.

20 Claims, 20 Drawing Sheets

SEMICONDUCTOR STRUCTURE AND METHOD OF MANUFACTURING THE SAME

TECHNICAL FIELD

The present disclosure relates to a semiconductor structure and a method of manufacturing the same, and more particularly, to a semiconductor structure with a drain stressor, a source stressor and a buried gate and a method of manufacturing the same.

DISCUSSION OF THE BACKGROUND

Reducing the size of semiconductor devices results in improved performance, increased capacity, and/or reduced cost. As semiconductor devices become smaller in size, however, a semiconductor device may not be able to realize diverse device characteristics. Therefore, size reduction requires more sophisticated techniques for semiconductor device manufacturing. For example, when scaling the channel length of a metal-oxide-semiconductor field-effect transistor (MOSFET) to a certain scale, short-channel effect might occur. A MOSFET device is considered to be short when the channel length is of the same order of magnitude as the depletion-layer widths of the source and drain junctions. Short-channel effects include, for example, drain-induced barrier lowering and hot carrier degradation.

Moreover, to enhance the performance of the semiconductor devices, strained silicon has been used. Strained silicon is a layer of silicon in which the silicon atoms are stretched beyond their normal interatomic distance. Moving these silicon atoms farther apart reduces the atomic forces that interfere with the movement of electrons through the transistors and thus improves carrier mobility, resulting in better chip performance and lower energy consumption. This can be accomplished by putting the layer of silicon over a substrate of, for example, silicon germanium (SiGe), in which the atoms are arranged farther apart than those of a silicon substrate.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. In one embodiment of the present disclosure, the semiconductor structure comprises a substrate having a pattern-dense region and a pattern-loose region; a first drain stressor disposed in the pattern-dense region; a first source stressor disposed in the pattern-dense region; a buried gate structure disposed in the pattern-dense region, between the first drain stressor and the first source stressor; a second drain stressor disposed in the pattern-loose region; a second source stressor disposed in the pattern-loose region; and a planar gate structure disposed in the pattern-loose region, between the second drain stressor and the second source stressor.

In some embodiments, the substrate comprises silicon, the first drain stressor and the first source stressor comprise silicon germanium, and the second drain stressor and the second source stressor comprise silicon germanium.

In some embodiments, the semiconductor structure further comprises a bit line connected to the first drain stressor.

In some embodiments, the semiconductor structure further comprises a bit line contact disposed between the first drain stressor and the bit line.

In some embodiments, the semiconductor structure further comprises a storage capacitor connected to the first source stressor.

In some embodiments, the semiconductor structure further comprises a storage node contact disposed between the storage capacitor and the first source stressor.

In some embodiments, the first drain stressor comprises a first drain layer, a second drain layer and a third drain layer, and the first source stressor comprises a first source layer, a second source layer, and a third source layer.

In some embodiments, the second drain stressor comprises a first drain layer, a second drain layer and a third drain layer, and the second source stressor comprises a first source layer, a second source layer, and a third source layer.

In some embodiments, the buried gate structure comprises a gate electrode, a gate dielectric layer between the gate electrode and the substrate, and a gate seal over the gate electrode.

In some embodiments, the planar gate structure comprises a gate electrode, a gate dielectric layer between the gate electrode and the substrate, and an oxide layer over the gate electrode.

Another aspect of the present disclosure provides a method of preparing a semiconductor structure. In one embodiment of the present disclosure, the method of preparing a semiconductor structure comprises the steps of: providing a substrate having a pattern-dense region and a pattern-loose region; forming a gate trench in the pattern-dense region; forming a buried gate structure in the gate trench and a planar gate structure in the pattern-loose region; forming a first drain recess and a first source recess in the pattern-dense region and a second drain recess and a second source recess in the pattern-loose region; and forming a first drain stressor and a first source stressor in the first drain recess and the first source recess in the pattern-dense region, and a second drain stressor and a second source stressor in the second drain recess and the second source recess in the pattern-loose region.

In some embodiments, the step of forming the buried gate structure comprises the steps of: forming a gate dielectric layer in the gate trench; forming a gate electrode in the gate trench, on the gate dielectric layer; and forming a gate seal on the gate electrode.

In some embodiments, the step of forming a gate trench in the substrate comprises selective etching.

In some embodiments, the step of forming a drain stressor and a source stressor comprises: forming a first silicon-containing layer; forming a second silicon-containing layer; and forming a third silicon-containing layer.

In some embodiments, the substrate comprises silicon, the first drain stressor and the first source stressor comprise silicon germanium, and the second drain stressor and the second source stressor comprise silicon germanium.

In some embodiments, the step of forming a first drain recess and a first source recess comprises selective etching.

In some embodiments, the method further comprises a step of forming a bit line contact on the first drain stressor.

In some embodiments, the method further comprises a step of forming a bit line connected to the first drain stressor via the bit line contact.

In some embodiments, the method further comprises a step of forming a storage node contact on the first source stressor.

In some embodiments, the method further comprises a step of forming a storage capacitor connected to the first source stressor via the storage node contact.

The semiconductor structure disclosed in the present disclosure includes a gate structure disposed in a gate trench; that is, the gate is buried in the substrate. The buried gate is completely buried under the surface of the substrate, so that the length of the channel is ensured by carefully designed gate trench dimensions, and the short-channel effects can therefore be avoided, which results in a semiconductor device with greater reliability.

Moreover, the drain stressor and the source stressor are employed to increase the interatomic distance of the substrate and therefore create a channel with a strained silicon layer. Thus, the mobility of the carriers in the channel can be significantly improved. This feature combined with the buried gate results in a product with better performance, lower energy consumption and greater reliability.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
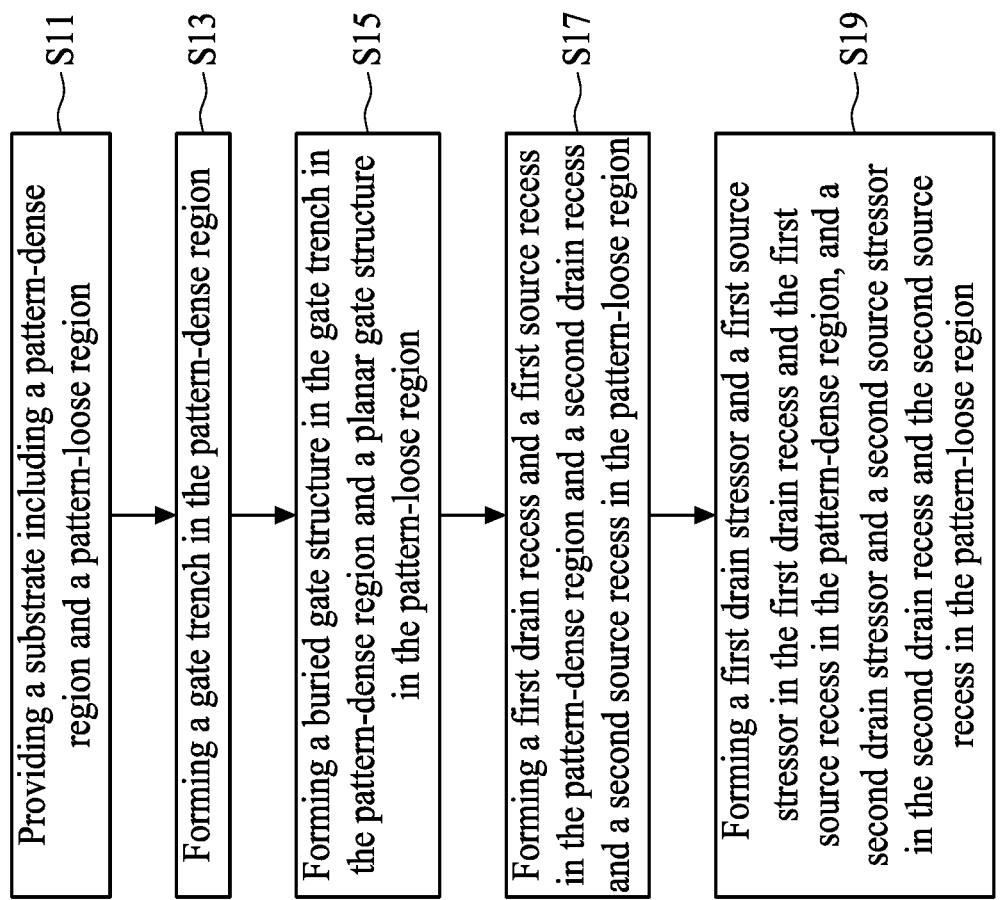
FIG. 1 is a flow diagram of a method of preparing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present method of preparing a semiconductor structure will be explained in detail below along with drawings. FIG. 1 is a flow diagram of a method 10 of preparing a semiconductor structure in accordance with some embodiments of the present disclosure, and FIG. 2 to FIG. 19 are sectional views showing steps of the method of preparing a semiconductor structure in accordance with some embodiments of the present disclosure.

Figure 2:
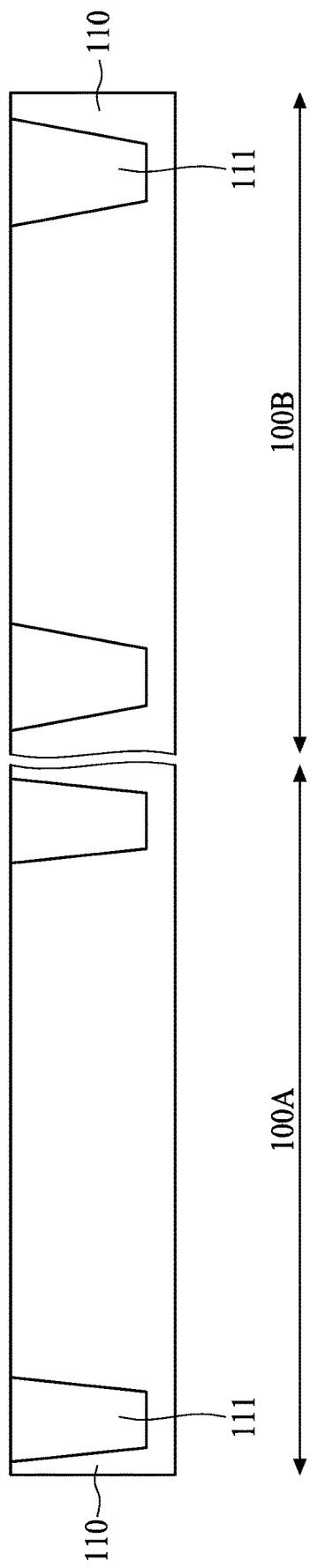
FIG. 2 to FIG. 19 are sectional views showing steps of the method of preparing a semiconductor structure in accordance with some embodiments of the present disclosure.

As shown in FIG. 1 and FIG. 2, the first step S11 of the method 10 includes providing a substrate 110. In some embodiments, the substrate 110 may be a semiconductor substrate, such as silicon, SiC, SiGe, an III-V compound semiconductor, combinations thereof, or the like. In some embodiments, the substrate 110 may include two regions: a pattern-dense region 100A such as a memory cell region and a pattern-loose region 100B such as a peripheral circuit region, wherein a shallow trench isolation 111 is provided in the substrate 110, as shown in FIG. 2.

In some embodiments, several STI trenches (not shown) may be formed on the substrate 110 and filled with dielectric material to form shallow trench isolations 111. In some embodiments, the STI trenches may be formed by selective etching. Next, to form the shallow trench isolation 111, the step of forming an insulating layer over the substrate 110 and the STI trenches may be performed. In some embodiments, the insulation layer may be formed by a single gap-filling process based on a fluid oxide layer. In some other embodiments, the insulation layer may be configured in the form of a combination (e.g., a stacked form) of the fluid oxide layer and the deposition oxide layer. For example, the fluid oxide layer may include a spin-on dielectric (SOD) and the deposition oxide layer may include a high-density plasma (HDP) oxide layer. The insulation layer is then polished by chemical mechanical polishing (CMP) to remove the insulation layer on the substrate 110. The insulation layer remaining in the STI trenches forms the shallow trench isolation 111.

Figure 3:
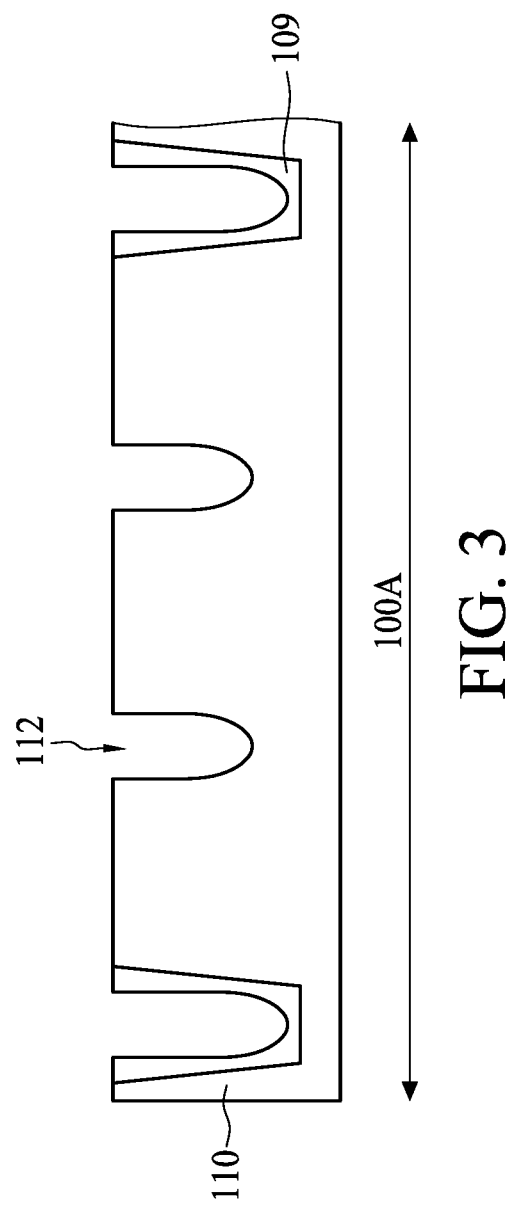
Figure 4:
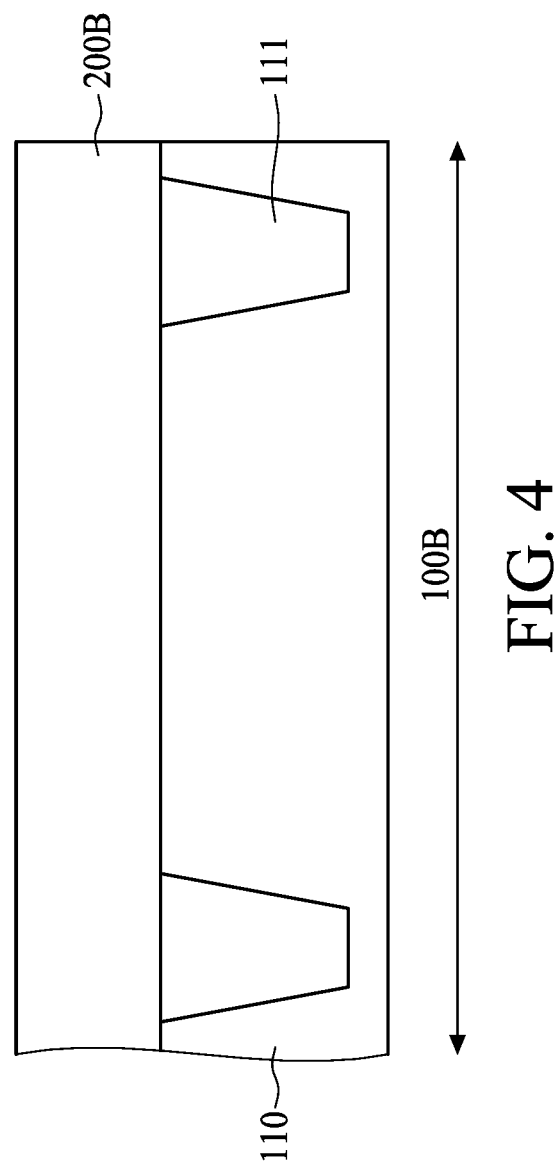

Please refer to FIG. 1 and FIGS. 3 to 4. In step S13, a gate trench 112 is formed in the pattern-dense region 100A of the substrate 110 as shown in FIG. 3, while the pattern-loose region 100B is covered by a hard mask 200B as shown in FIG. 4. In some embodiments, the pattern-dense region 100A of the substrate 110 is selectively etched to form the gate trench 112. In some embodiments, a hard mask layer (not shown) is formed on the substrate 110 and a photoresist pattern (not shown) for defining the gate area is formed on the hard mask layer. In such case, the hard mask layer may be configured in a stacked form of an amorphous carbon layer (ACL) and a SiON layer, for example. The hard mask layer is then etched using the photoresist pattern as an etch mask, so that a hard mask pattern (not shown) is formed.

Subsequently, the photoresist pattern is removed, and the substrate 110 is etched using the hard mask pattern as an etch mask, such that the gate trench 112 is formed on the substrate 110. In some embodiments, the trench may be formed by etching not only the active region of the substrate but also the shallow trench isolation 111. Generally, a gate is configured in the form of a line, so that the active region and the shallow trench isolation 111 are simultaneously etched and a line-type trench is formed. In such case, the active region and the shallow trench isolation 111 have different etch selectivity ratios, so that the shallow trench isolation 111 is etched more deeply than the active region. That is, the active region is configured in the form of a fin gate, such that it protrudes more than the shallow trench isolation 111 in the gate region.

Figure 5:
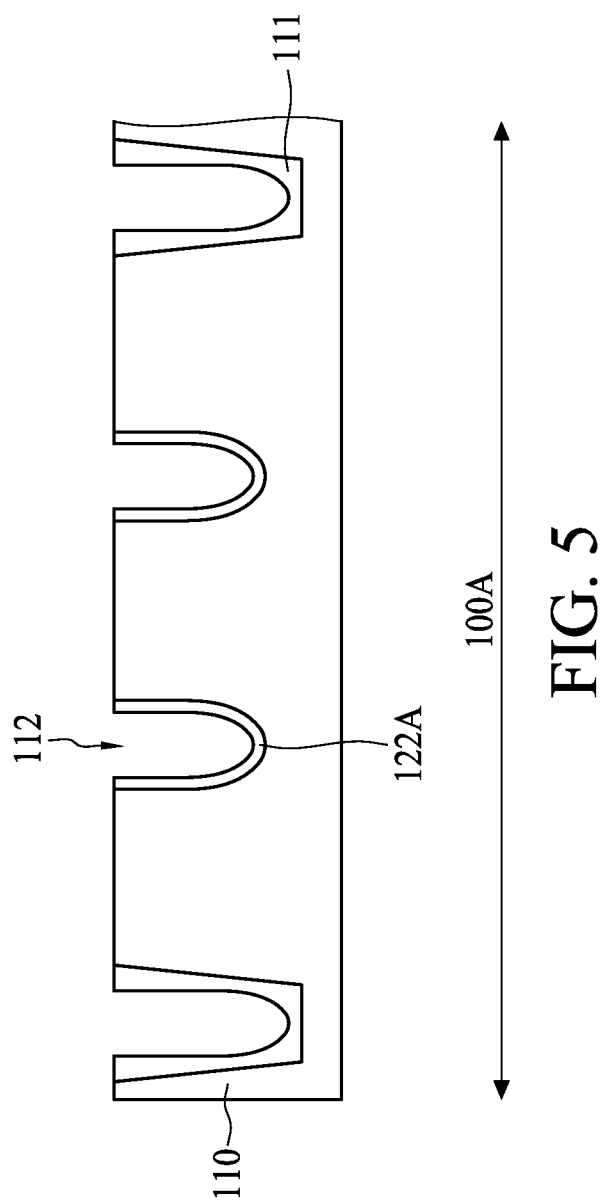
Figure 6:
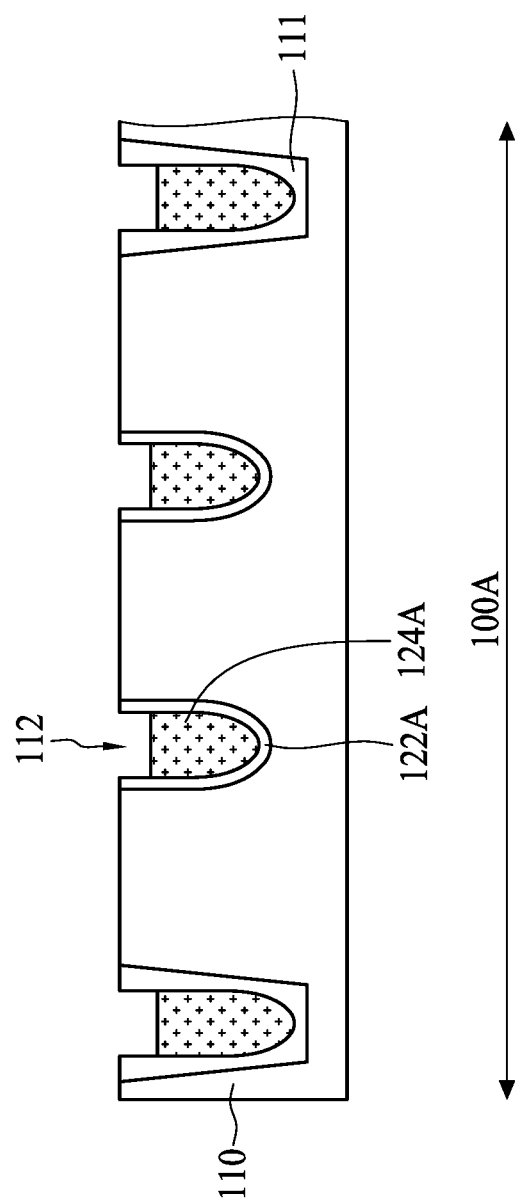
Figure 7:
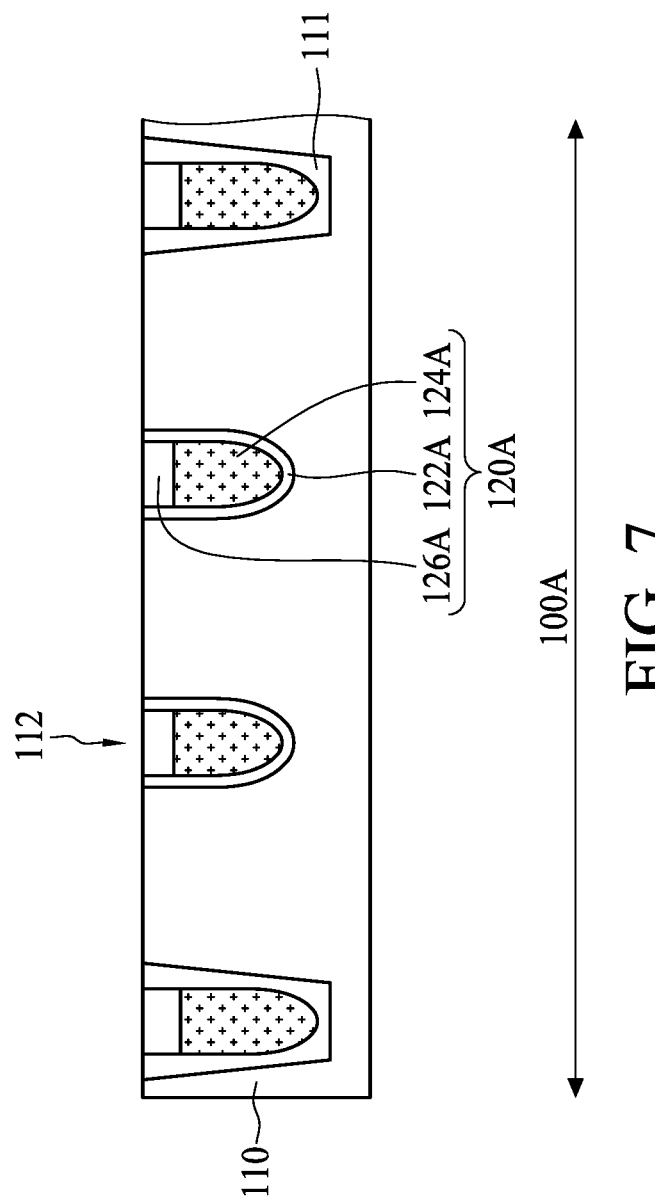
Figure 9:
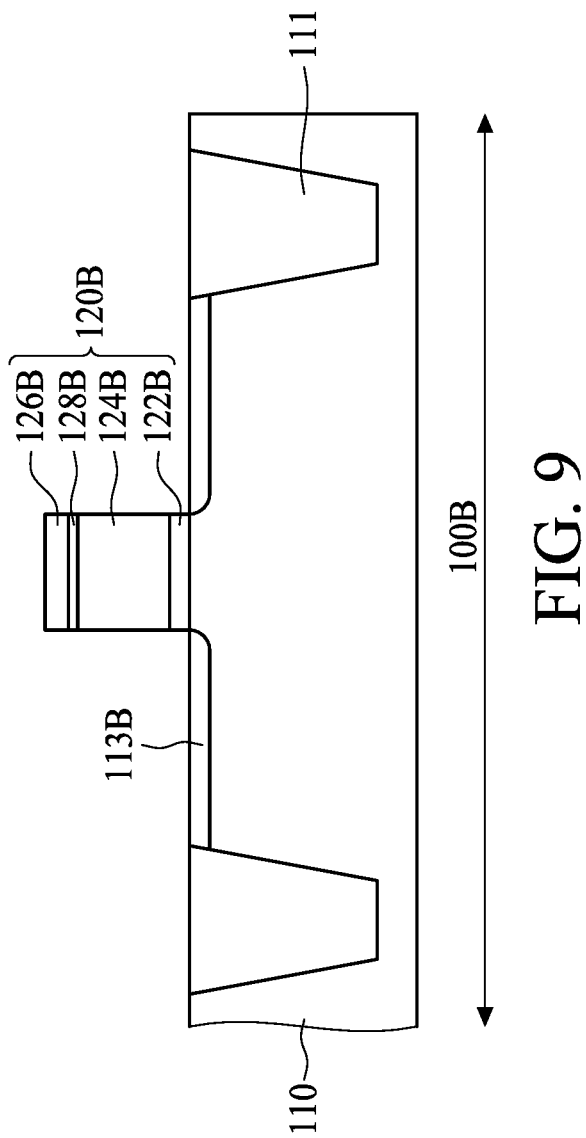
Figure 10:
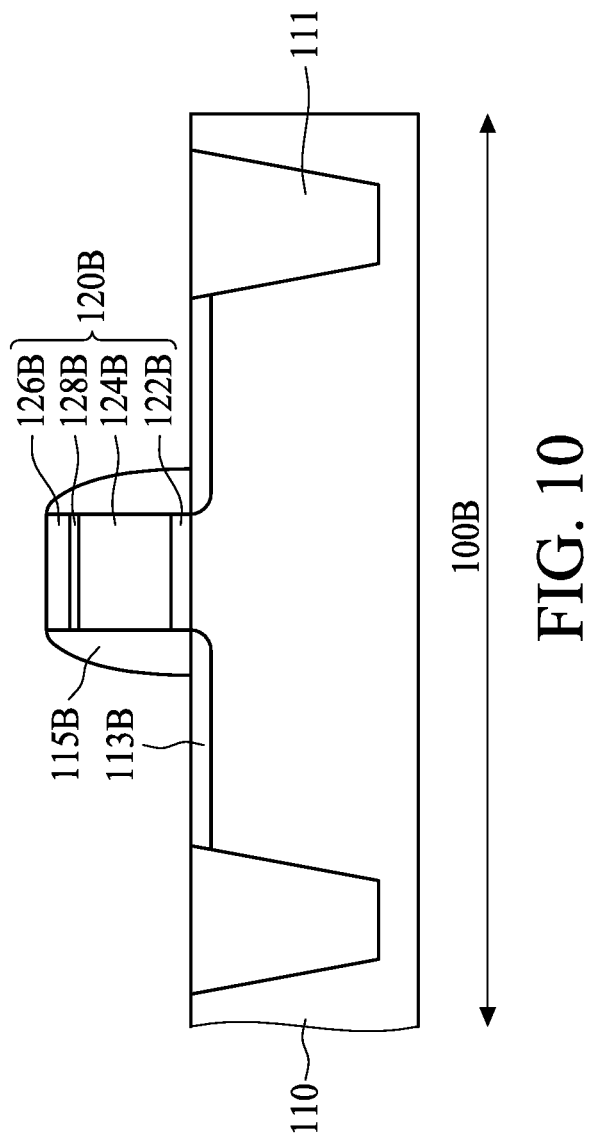

Please refer to FIG. 1. In step S15, a buried gate structure 120A is formed in the gate trench 112 in the pattern-dense region 100A as shown in FIGS. 5 to 7, and a planar gate structure 120B is formed in the pattern-loose region 100B as shown in FIGS. 9 to 10. In some embodiments, referring to FIG. 5, the buried gate structure 120A may include a gate dielectric layer 122A, which may be an oxide layer and formed by performing an oxidation process in the gate trench 112 to oxidize the substrate 110 in the gate trench 112, while the pattern-loose region 100B is covered by the hard mask 200B, as shown in FIG. 4.

Next, referring to FIG. 6, a gate electrode 124A is formed in the gate trench 112. In some embodiments, the gate electrode 124A can be formed by depositing a metal layer (not shown) on the substrate 110 and in the gate trench 112, and then processing the metal layer until the metal layer is lower than the surface of the substrate 110 and the remaining metal layer fills only part of the gate trench 112. In such case, the metal layer may, for example, include a titanium nitride (TiN) layer, a tantalum nitride (TaN) layer, a tungsten (W) layer, or the like. In order to reduce resistance of the gate electrode 124A, a thin titanium nitride layer (or a tantalum nitride layer) may be conformably deposited, and the tungsten layer may be used for gap filling in such a manner as to form the gate electrode 124A with low resistance.

In some embodiments, the gate electrode 124A may be formed by depositing the titanium nitride layer and the tantalum nitride layer, or may be formed by sequentially depositing the titanium nitride layer, the tantalum nitride layer, and the tungsten layer. The metal layer deposited may then be planarized by CMP or the like. Subsequently, the metal layer is etched back and cleaned in such a manner that the metal layer is buried in only some parts of the trench, so that the gate electrode 124A is formed. In such case, the etch-back process is continuously conducted until the surface of the metal layer in the gate trench 112 is lower than the surface of the substrate 110 and the desired height of the gate electrode 124A is obtained.

In some embodiments, referring to FIG. 7, the gate electrode 124A can next be sealed with a gate seal 126A. In such case, a sealing layer (not shown), such as a nitride layer, may be formed to seal the upper part of the gate trench 112 and protect the gate electrode 124A. In some embodiments, after the sealing layer is sealed in a manner such that the gate trench 112 is completely filled with the nitride layer, the sealing layer is selectively removed by a strip process, so that the sealing layer remains only over the gate electrode 124A and in the gate trench 112.

Figure 8:
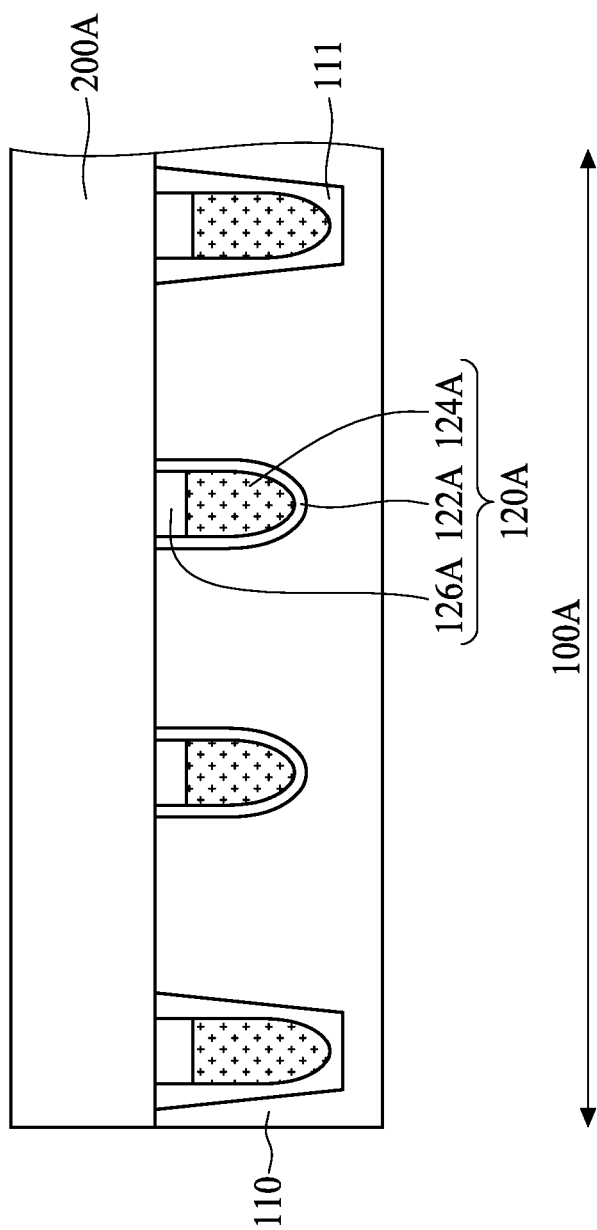

In some embodiments, the pattern-dense region 100A is covered by a hard mask 200A as shown in FIG. 8, while the planar gate structure 120B is formed in the pattern-loose region 100B as shown in FIGS. 9 to 10. In some embodiments, the planar gate structure 120B is formed on the semiconductor substrate 110. The planar gate structure 120B includes a gate dielectric 122B and a gate electrode 124B. The gate dielectric 122B includes silicon oxide in some exemplary embodiments. In alternative embodiments, other dielectric materials may also be used, such as silicon nitride, silicon carbide (SiC), or the like. The gate electrode 124B may include polysilicon. In some embodiments, the planar gate structure 120B further includes a hard mask 126B over the gate electrode 124B. The hard mask 126B may include silicon nitride, for example, while other materials, such as silicon carbide (SiC), silicon oxynitride, and the like, may also be used. In some embodiments, the planar gate structure 120B further includes an oxide layer 128B between the hard mask 126B and the gate electrode 124B to adhere the hard mask 126B on the gate electrode 124B. In alternative embodiments, the hard mask 126B and the oxide layer 128B are not formed.

Next, referring to FIG. 9, lightly-doped drain and source (LDD) regions 113B are formed by, for example, implanting an n-type impurity (such as phosphorous and/or arsenic) into the semiconductor substrate 110. For example, when the resulting metal-oxide-semiconductor (MOS) device is an nMOS device, the LDD regions 113B are n-type regions. The planar gate structure 120B acts as an implantation mask, so that the edges of the LDD regions 113B are substantially aligned with the edges of the planar gate structure 120B.

Next, referring to FIG. 10, gate spacers 115B are formed on sidewalls of the planar gate structure 120B. In some embodiments, at least one of the gate spacers 115B include one or more layers, including silicon nitride, silicon oxynitride, silicon oxide, or other dielectric materials. Possible formation methods include plasma enhanced chemical vapor deposition (PECVD), low-pressure chemical vapor deposition (LPCVD), sub-atmospheric chemical vapor deposition (SACVD), and other deposition methods.

Figure 11:
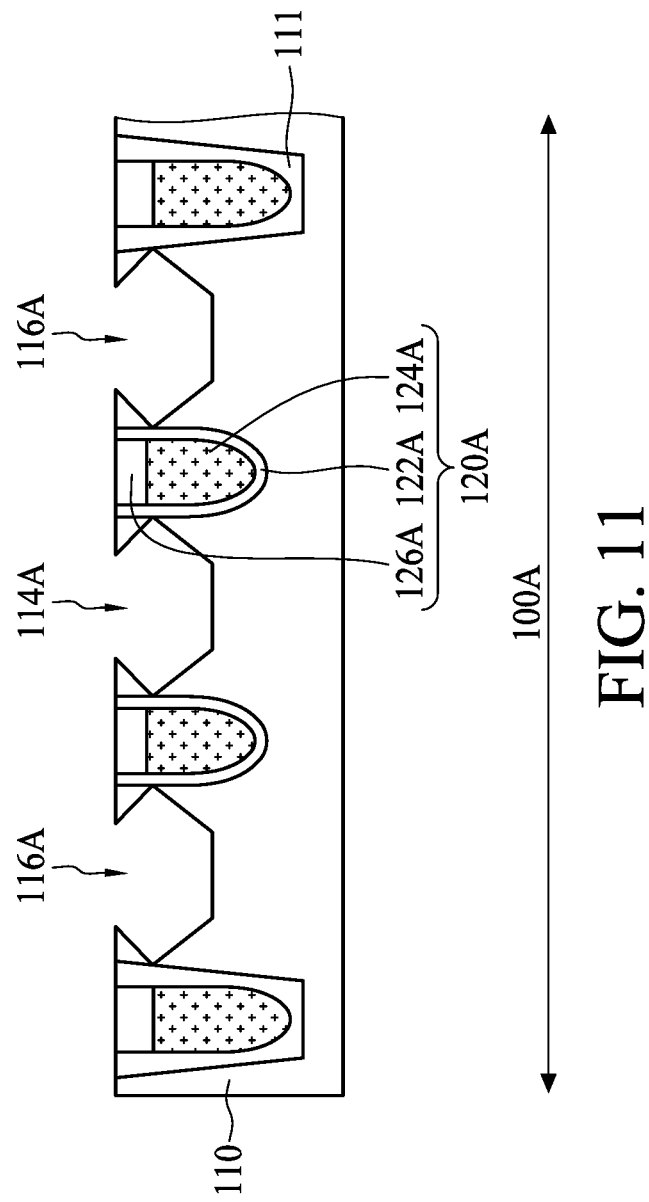
Figure 12:
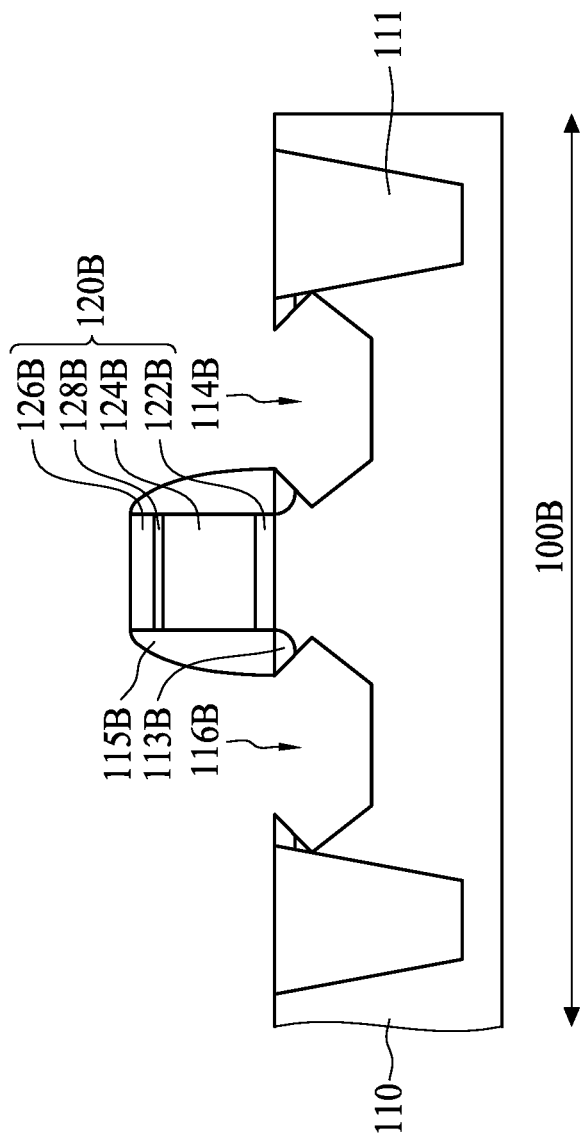

Next, referring to FIG. 1, in step S17, a drain recess 114A and a source recess 116A are formed in the pattern-dense region 100A of the substrate 110 as shown in FIG. 11, while a drain recess 114B and a source recess 116B are formed in the pattern-loose region 100B of the substrate 110 as shown in FIG. 12. In some embodiments, a hard mask (not shown) that defines the drain and source areas can be formed by a photolithography process, and the drain recess 114A, 114B and the source recess 116A, 116B may be formed using, for example, a wet etch process selective to the material of the substrate 110, wherein the wet etch process uses the hard mask to form the drain recess 114A, 114B and the source recess 116A, 116B. For example, an etchant, such as carbon tetrafluoride ($CF_4$), tetramethylammonium hydroxide (THMA), combinations of these, or the like, may be used to perform the wet etch process and to form the drain recess 114A, 114B and the source recess 116A, 116B.

Figure 13:
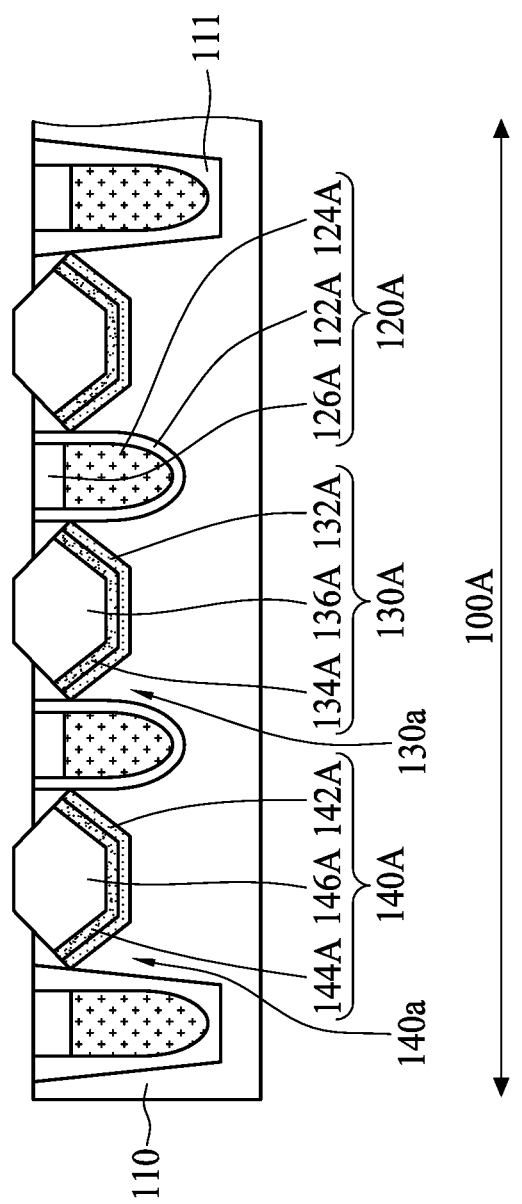
Figure 14:
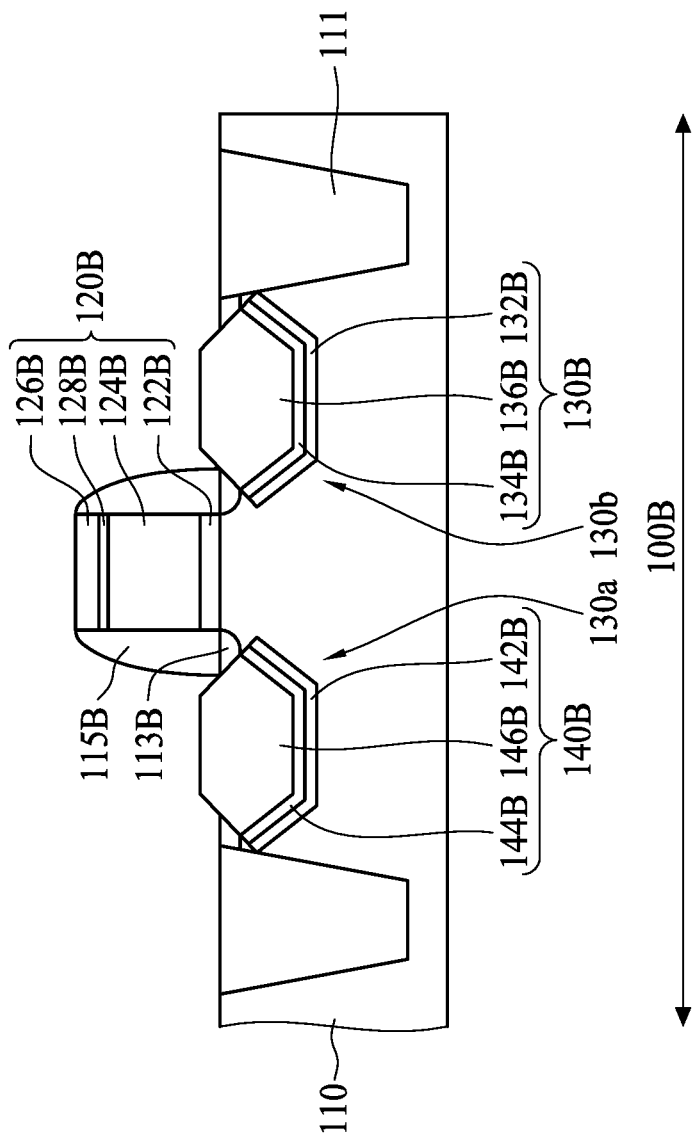

In step S19, a drain stressor 130A and a source stressor 140A are formed in the drain recess 114A and the source recess 116A, respectively, in the pattern-dense region 100A of the substrate 110 as shown in FIG. 13, while a drain stressor 130B and a source stressor 140B are formed in the drain recess 114B and the source recess 116B, respectively, in the pattern-loose region 100B of the substrate 110 as shown in FIG. 14. In some embodiments, the drain stressor 130A includes a first drain layer 132A, a second drain layer 134A, and a third drain layer 136A, and the source stressor 140A includes a first source layer 142A, a second source layer 144A, and a third source layer 146A. In some embodiments, the drain stressor 130B includes a first drain layer 132B, a second drain layer 134B, and a third drain layer 136B, and the source stressor 140B includes a first source layer 142B, a second source layer 144B, and a third source layer 146B.

In some embodiments, the drain stressor 130A, 130B and the source stressor 140A, 140B may be formed by a cyclic deposition and etching (CDE) process. The CDE process includes an epitaxial deposition/partial etch process, which is repeated one or more times. In such case, a first silicon-containing layer (not shown) is epitaxially deposited in the drain recess 114A, 114B and the source recess 116A, 116B. In some embodiments, the resulting metal-oxide-semiconductor (MOS) device is an nMOS device, and the first silicon-containing layer may be made of, for example, silicon, silicon carbide, other semiconductor materials, and/or combinations thereof. The deposition of the first silicon-containing layer may use at least one silicon-containing precursor, such as silane ($SiH_4$), trisilane ($Si_3H_8$), disilane ($Si_2H_6$), dichlorosilane ($SiH_2Cl_2$), other silicon-containing precursors, and/or combinations thereof. In some embodiments, the deposition of the first silicon-containing layer may include in-situ doping of the first silicon-containing layer. When the resulting metal-oxide-semiconductor (MOS) device is an nMOS device, an n-type doping precursor, for example, phosphine ($PH_3$) and/or other n-type doping precursors, may be used.

In some embodiments, the deposition of the first silicon-containing layer may use a carrier gas to introduce the silicon-containing precursor and the n-type doping precursor into the process chamber. The carrier gas may be, for example, nitrogen gas ($N_2$), hydrogen gas ($H_2$), or combinations thereof. In some embodiments, the first silicon-containing layer may be formed by chemical vapor deposition (CVD), for example, atomic-layer CVD (ALCVD), ultra-high vacuum CVD (UHVCVD), low-pressure CVD (LPCVD), reduced-pressure CVD (RPCVD), or other suitable CVDs; molecular beam epitaxy (MBE) process; other suitable epitaxial processes; or combinations thereof. Next, a portion of the first silicon-containing layer in the drain recess 114A, 114B and the source recess 116A, 116B is removed to form the first drain layer 132A, 132B and the first source layer 142A, 142B. In some embodiments, the removal of the first silicon-containing layer may include use of an etch gas including at least one of hydrogen chloride (HCl), chlorine ($Cl_2$), germanium hydride ($GeH_4$), and other suitable etch gases.

Next, a second silicon-containing layer (not shown) is epitaxially deposited on the remaining first drain layer 132A, 132B and the first source layer 142A, 142B. In some embodiments, the material and the method of forming the second silicon-containing layer are the same as or similar to those of the first silicon-containing layer as described above. In some embodiments, the second silicon-containing layer may have a dopant concentration different from that of the first silicon-containing layer. A portion of the second silicon-containing layer in the drain recess 114A, 114B and the source recess 116A, 116B is then removed to form the second drain layer 134A, 134B and the second source layer 144A, 144B, which are on the first drain layer 132A, 132B and the first source layer 142A, 142B, respectively. In some embodiments, the removal of the second silicon-containing layer is the same as or similar to the removal of the first silicon-containing layer described above.

Subsequently, a third silicon-containing layer (not shown) is epitaxially deposited to fill the remaining space of the drain recess 114A, 114B and the source recess 116A, 116B by a selective epitaxial growth (SEG) process. The SEG process is a selective deposition process, and the third silicon-containing layer formed by this process is deposited on the second drain layer 134A, 134B and the second source layer 144A, 144B to form the third drain layer 136A, 136B and the third source layer 146A, 146B. The third silicon-containing layer deposited by the SEG process may be formed above the top surface of the substrate 110, in accordance with some embodiments. In alternative embodiments, the top surface of the third silicon-containing layer may be substantially level with the top surface of the substrate 110. In some embodiments, the third silicon-containing layer is doped with phosphorus (P).

In some embodiments, the drain stressor 130A includes a strained part 130a buried in the substrate 110, and the source stressor 140A includes a strained part 140a buried in the substrate 110. In some embodiments, the drain stressor 130B includes a strained part 130b buried in the substrate 110, and the source stressor 140B includes a strained part 140b buried in the substrate 110.

Figure 15:
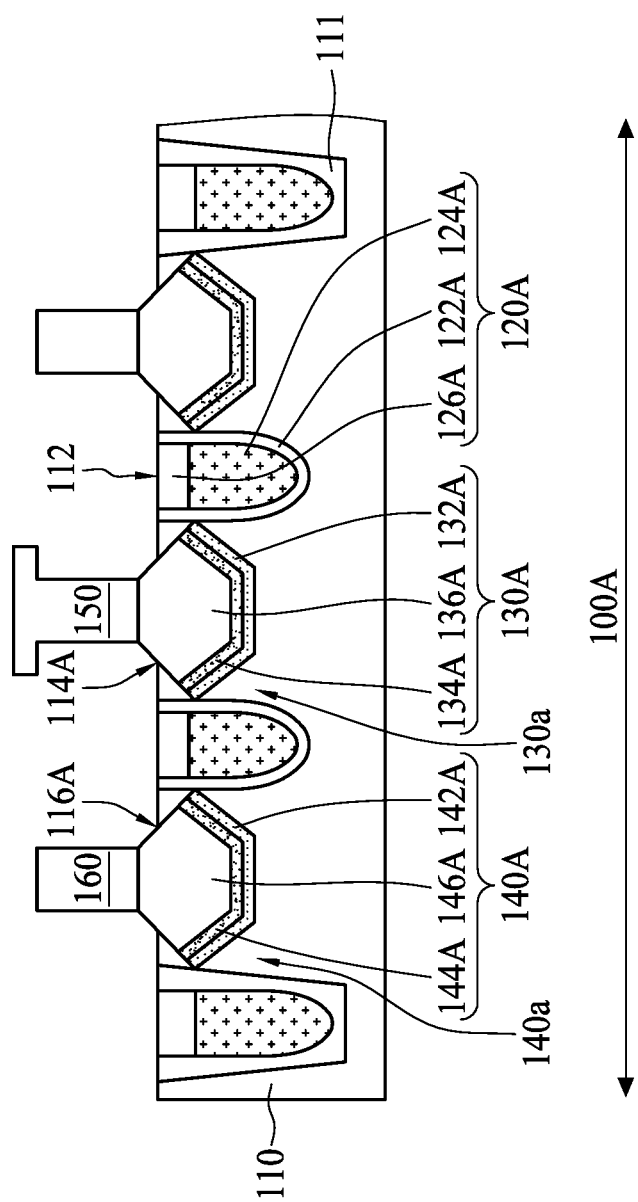
Figure 16:
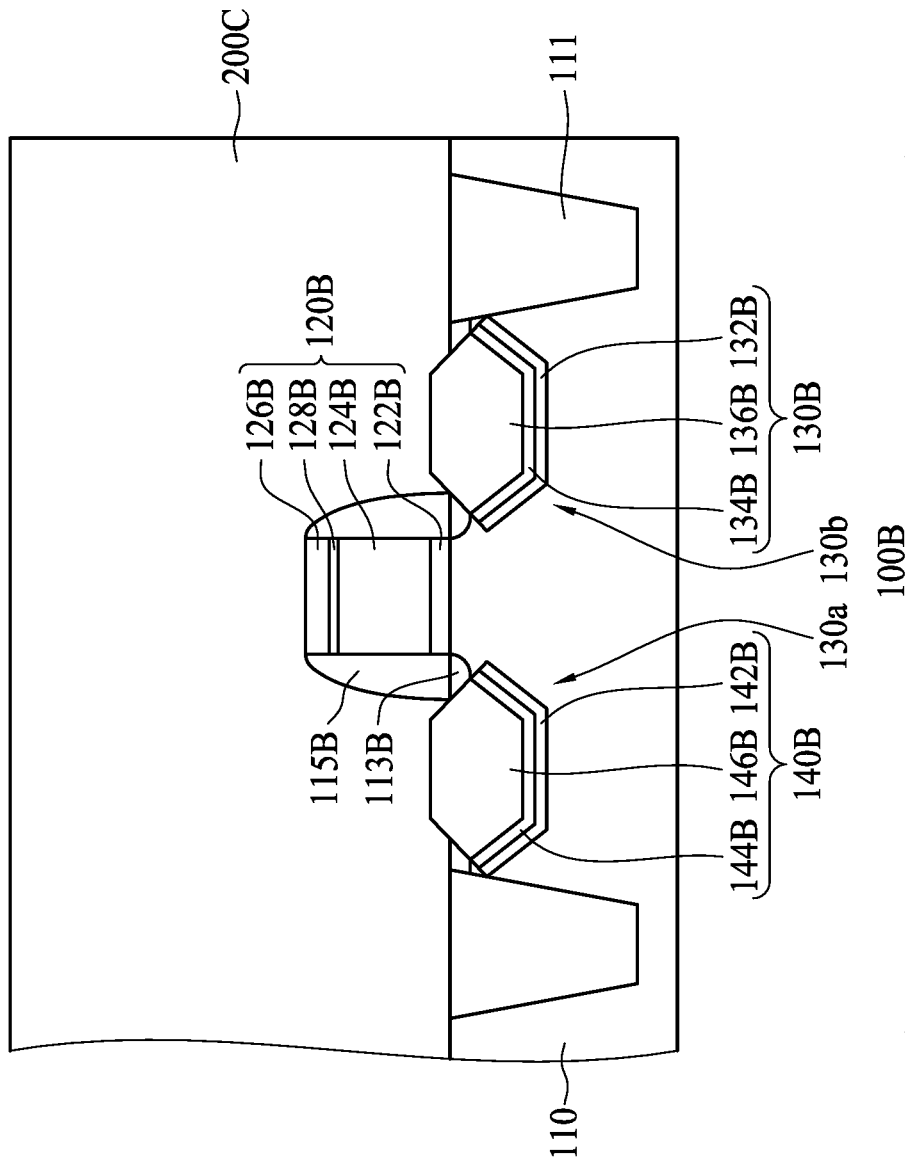

In some embodiments, the manufacturing process may continue to implement a semiconductor structure, as shown in FIGS. 15 to 20. In such case, a bit line contact 150 and a storage node contact 160 can be formed on the drain stressor 130A and the source stressor 140A, respectively, as shown in FIG. 15, while the pattern-loose region 100B is covered by a hard mask 200C as shown in FIG. 16. In some embodiments, forming the bit line contact 150 and the storage node contact 160 may include depositing a conductive layer (not shown), such as a copper layer, on the substrate 110, wherein the conductive layer is in contact with the drain stressor 130A and the source stressor 140A. In such case, the conductive layer can then be etched to remove the part of the conductive layer that is not in contact with the drain stressor 130A and the source stressor 140A to form the bit line contact 150 and the storage node contact 160. In some embodiments, a damascene or dual damascene process can be used to form the bit line contact 150 and the storage node contact 160 of more complicated shapes. In some embodiments, the forming of the bit line contact 150 and the storage node contact 160 can be performed in the same step as that in which the conductive layer is formed. In other embodiments, the bit line contact 150A and the storage node contact 160A can be formed separately.

Figure 17:
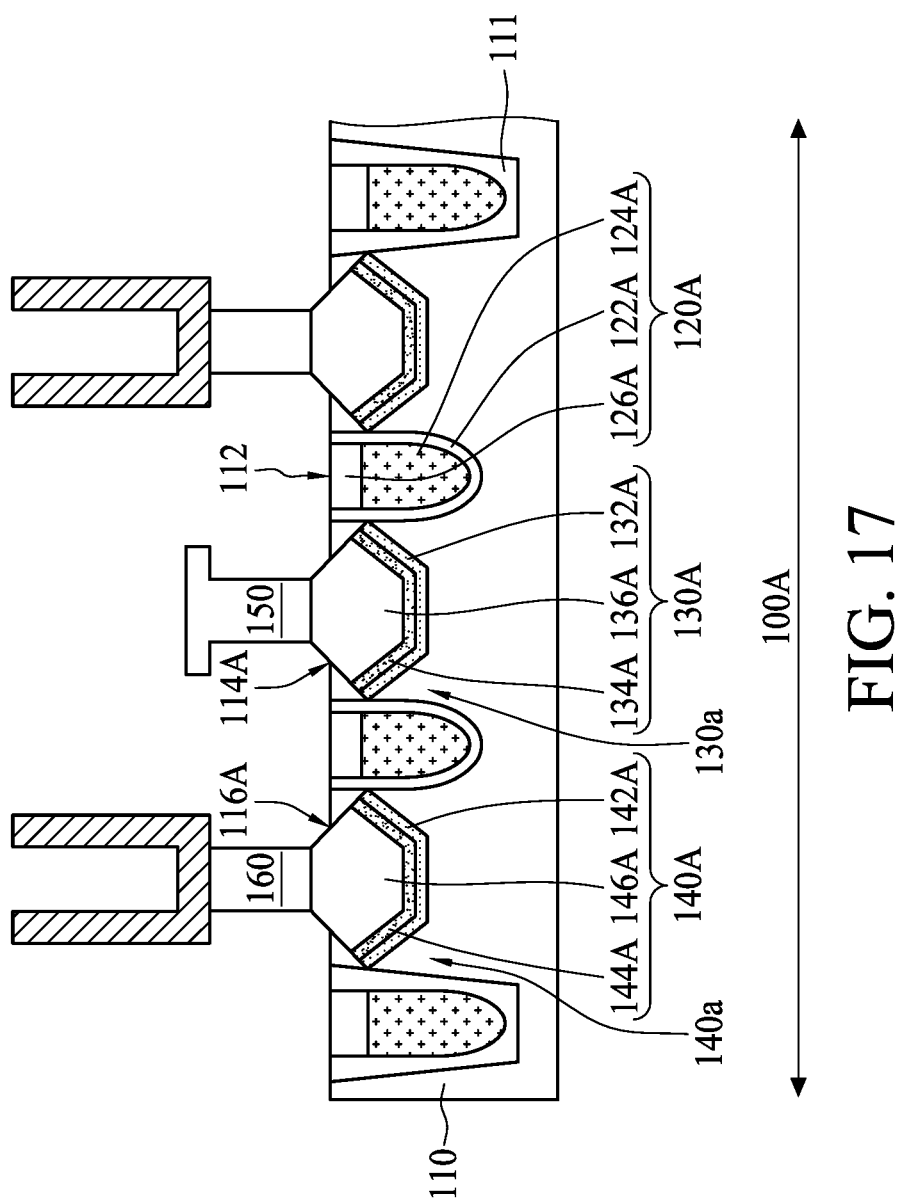

Next, referring to FIG. 17, an inter-layer dielectric (not shown) is formed on the substrate 110, and a storage node contact hole (not shown) is formed on the inter-layer dielectric, wherein the storage node contact hole exposes the storage node contact 160 on the substrate 110. Next, a conductive layer (not shown) is formed on the inter-layer dielectric and fills the storage node contact hole. Subsequently, the conductive layer is patterned by a photolithography process to form a storage node 184.

Figure 18:
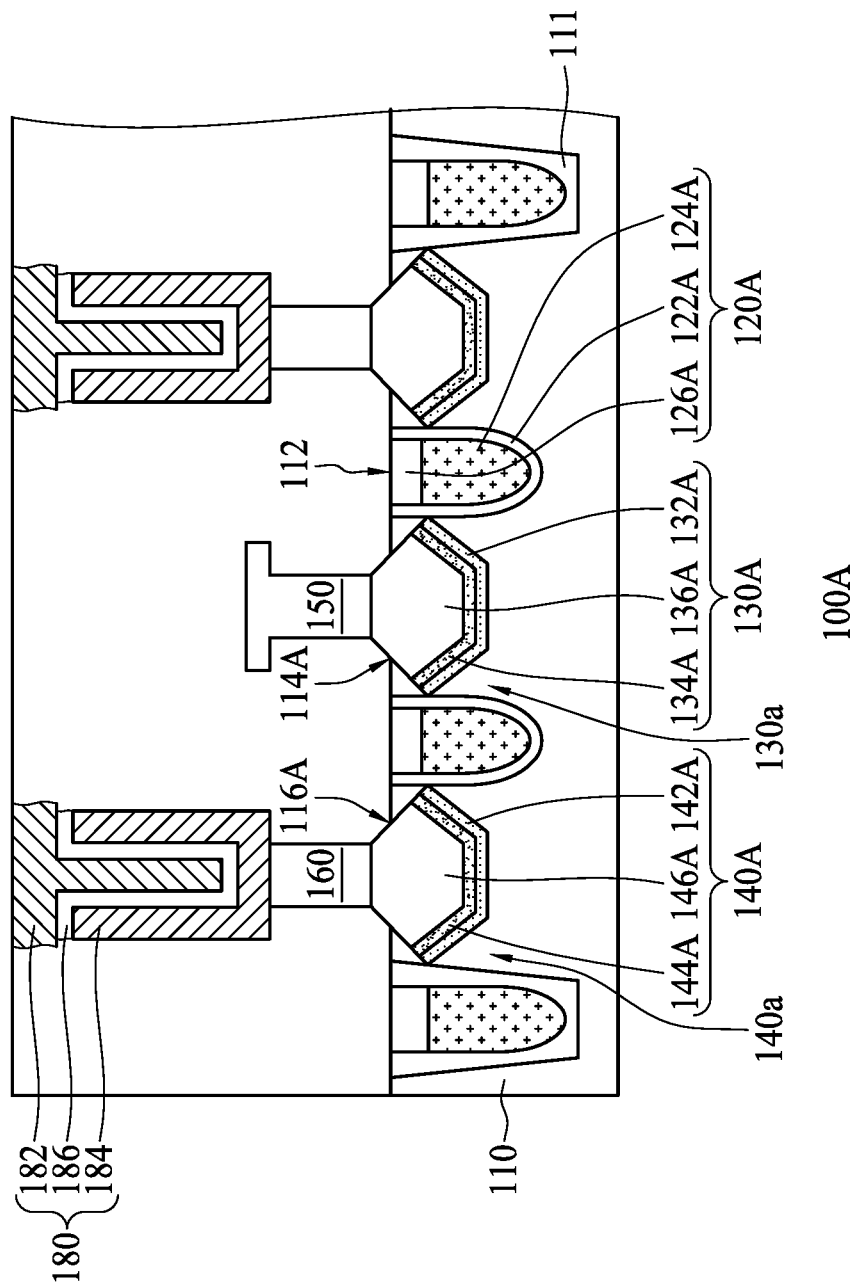

Next, referring to FIG. 18, a dielectric layer 186 can be formed on the storage node 184 using a method such as CVD or oxidation. In some embodiments, the dielectric layer 186 may be a sandwich structure of $SiO_2$—$Si_3N_4$—$SiO_2$. Finally, the cell plate 182 may be formed by forming a polycrystalline silicon layer (not shown) using LPCVD and then performing a photolithography process to define the pattern of the cell plate 182, implementing a storage capacitor 180 connected to the source stressor 140A.

Figure 19:
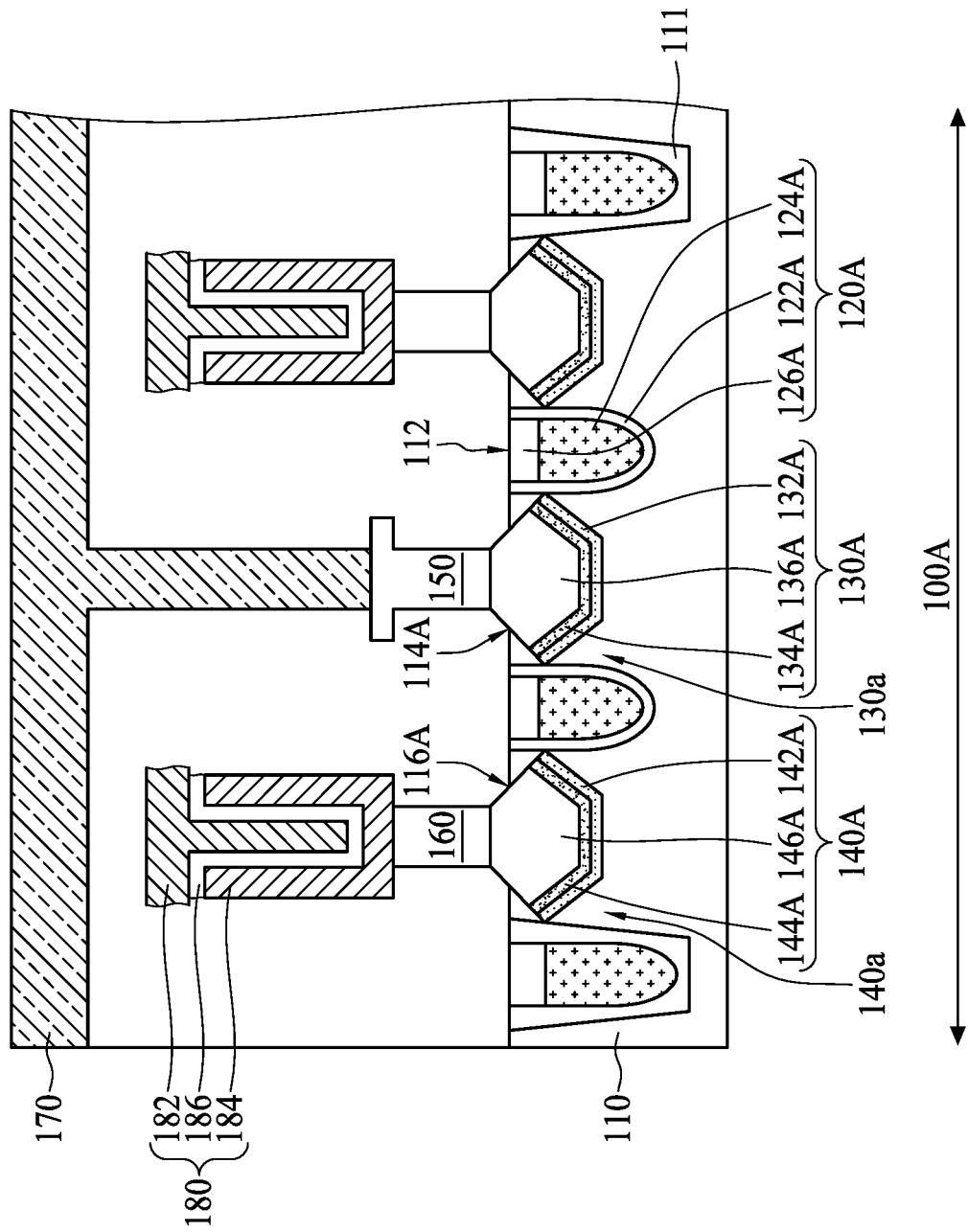

Next, referring to FIG. 19, in some embodiments, a bit line 170 can be formed, wherein the bit line 170 is connected to the bit line contact 150. In some embodiments, the forming of the bit line 170 may include the following steps: forming an inter-layer dielectric (not shown); forming a bit line contact hole (not shown) on the inter-layer dielectric, wherein the bit line contact hole exposes the bit line contact 150 on the substrate 110; forming a conductive layer (not shown) on the inter-layer dielectric and filling the bit line contact hole; and patterning the conductive layer to form the bit line 170.

Figure 20:
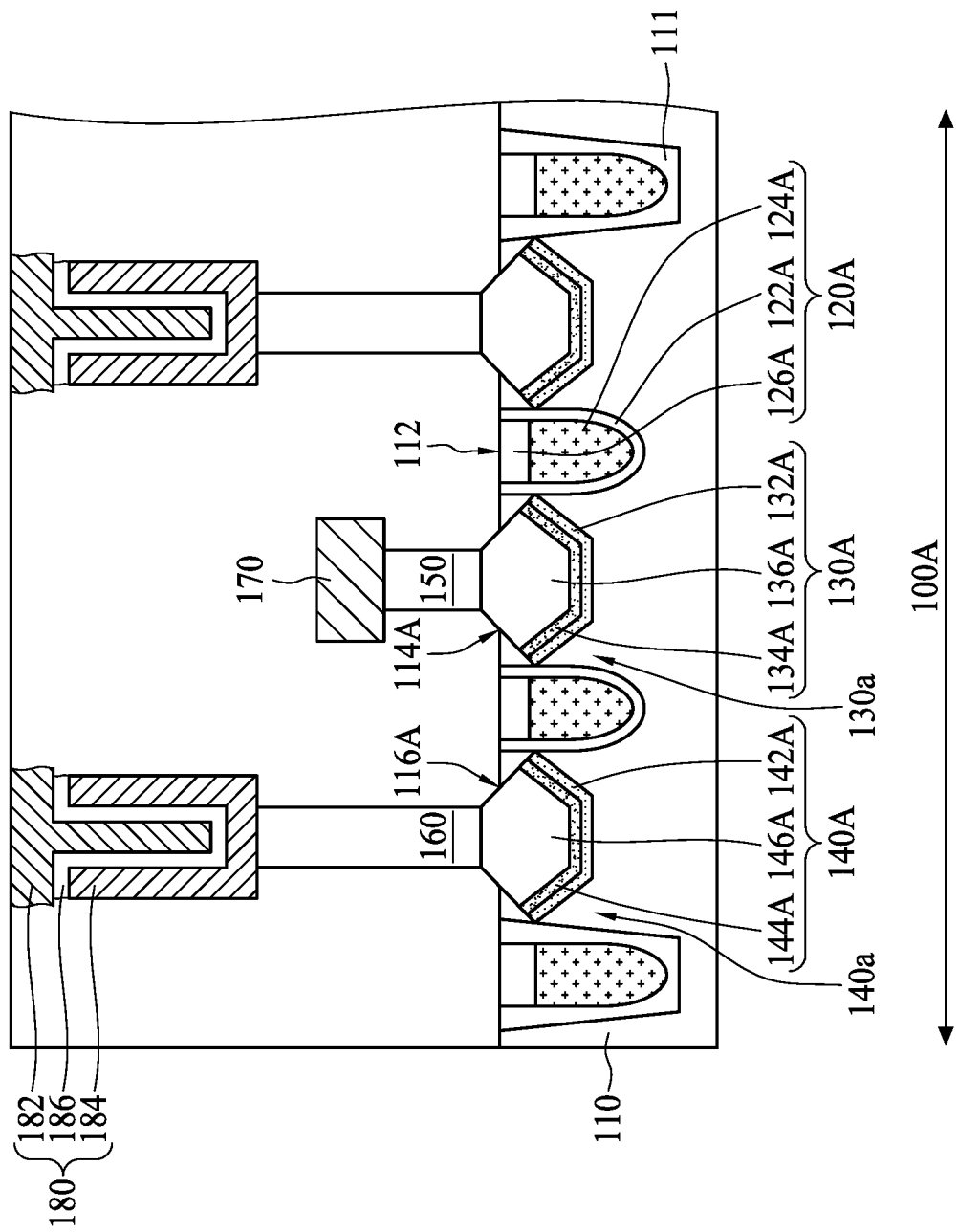
FIG. 20 is a sectional view showing a semiconductor structure in accordance with some embodiments of the present disclosure.

In some embodiments, referring to FIG. 20, the bit line 170 is formed below the storage capacitor 180, i.e., a memory structure with the storage capacitor over the bit line. In contrast, the memory structure shown in FIG. 19 has the storage capacitor under the bit line.

In summary, the semiconductor structures disclosed in the present disclosure include buried gates and drain/source stressors 130, 140. During the manufacturing of the buried gate, the length of the channel can be ensured by determining the depth of the gate trench, thereby reducing the short-channel effect and resulting in devices with greater reliability.

Moreover, the semiconductor structures disclosed in the present disclosure also include a drain stressor and a source stressor, which create strained silicon layers having greater interatomic distances, thus reducing atomic force interference of the carriers and resulting in carriers with greater mobility and therefore devices with better performance.

In one embodiment, the present disclosure provides a semiconductor structure. The semiconductor structure includes a substrate, a gate structure, a drain stressor and a source stressor. Each of the source stressor and the drain stressor includes a strained part disposed in the substrate. The gate structure is disposed in the substrate, between the drain stressor and the source stressor.

In another embodiment, the present disclosure provides a method of manufacturing a semiconductor structure. The method of manufacturing the semiconductor structure begins with providing a substrate. Next, a gate trench is formed on the substrate. The following step is to form a gate structure in the gate trench. In the next step, a drain recess and a source recess are formed on the substrate so that the gate trench is between the drain recess and the source recess. Finally, a drain stressor and a source stressor are formed in the drain recess and the source recess, respectively.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor structure, comprising:
   a substrate having a pattern-dense region and a pattern-loose region;
   a first drain stressor disposed in the pattern-dense region;
   a first source stressor disposed in the pattern-dense region;
   a buried gate structure disposed in the pattern-dense region, between the first drain stressor and the first source stressor;
   a second drain stressor disposed in the pattern-loose region;
   a second source stressor disposed in the pattern-loose region; and
   a planar gate structure disposed in the pattern-loose region, between the second drain stressor and the second source stressor.

2. The semiconductor structure of claim 1, wherein the substrate comprises silicon, the first drain stressor and the first source stressor comprise silicon germanium, and the second drain stressor and the second source stressor comprise silicon germanium.

3. The semiconductor structure of claim 1, further comprising a bit line connected to the first drain stressor.

4. The semiconductor structure of claim 3, further comprising a bit line contact disposed between the first drain stressor and the bit line.

5. The semiconductor structure of claim 1, further comprising a storage capacitor connected to the first source stressor.

6. The semiconductor structure of claim 5, further comprising a storage node contact disposed between the storage capacitor and the first source stressor.

7. The semiconductor structure of claim 1, wherein the first drain stressor comprises a first drain layer, a second drain layer and a third drain layer, and the first source stressor comprises a first source layer, a second source layer, and a third source layer.

8. The semiconductor structure of claim 1, wherein the second drain stressor comprises a first drain layer, a second drain layer and a third drain layer, and the second source stressor comprises a first source layer, a second source layer, and a third source layer.

9. The semiconductor structure of claim 1, wherein the buried gate structure comprises a gate electrode, a gate dielectric layer between the gate electrode and the substrate, and a gate seal over the gate electrode.

10. The semiconductor structure of claim 1, wherein the planar gate structure comprises a gate electrode, a gate dielectric layer between the gate electrode and the substrate, and an oxide layer over the gate electrode.

11. A method of preparing a semiconductor structure, comprising the steps of:
   providing a substrate having a pattern-dense region and a pattern-loose region;
   forming a gate trench in the pattern-dense region;
   forming a buried gate structure in the gate trench and a planar gate structure in the pattern-loose region;
   forming a first drain recess and a first source recess in the pattern-dense region and a second drain recess and a second source recess in the pattern-loose region; and
   forming a first drain stressor and a first source stressor in the first drain recess and the first source recess in the pattern-dense region, and a second drain stressor and a second source stressor in the second drain recess and the second source recess in the pattern-loose region.

12. The method of preparing a semiconductor structure of claim 11, wherein the step of forming the buried gate structure comprises the steps of:
   forming a gate dielectric layer in the gate trench;
   forming a gate electrode in the gate trench, on the gate dielectric layer; and
   forming a gate seal on the gate electrode.

13. The method of preparing a semiconductor structure of claim 11, wherein the step of forming a gate trench in the substrate comprises selective etching.

14. The method of preparing a semiconductor structure of claim 11, wherein the step of forming a drain stressor and a source stressor comprises:
forming a first silicon-containing layer;
forming a second silicon-containing layer; and
forming a third silicon-containing layer.

15. The method of preparing a semiconductor structure of claim 11, wherein the substrate comprises silicon, the first drain stressor and the first source stressor comprise silicon germanium, and the second drain stressor and the second source stressor comprise silicon germanium.

16. The method of manufacturing a semiconductor structure of claim 11, wherein the step of forming a first drain recess and a first source recess comprises selective etching.

17. The method of preparing a semiconductor structure of claim 11, further comprising a step of forming a bit line contact on the first drain stressor.

18. The method of preparing a semiconductor structure of claim 17, further comprising a step of forming a bit line connected to the first drain stressor via the bit line contact.

19. The method of preparing a semiconductor structure of claim 11, further comprising a step of forming a storage node contact on the first source stressor.

20. The method of preparing a semiconductor structure of claim 11, further comprising a step of forming a storage capacitor connected to the first source stressor via the storage node contact.

* * * * *